(12) United States Patent  
Colson et al.

(10) Patent No.: US 6,805,771 B1  
(45) Date of Patent: Oct. 19, 2004

(54) PRESSURE LAMINATOR APPARATUS AND NON WOVEN FABRIC FORMED THEREBY

(75) Inventors: Wendell B. Colson, Weston, MA (US); Kevin Dann, Denver, CO (US)

(73) Assignee: Hunter Douglas Industries B.V., Rotterdam (NL)

( * ) Notice: Subject to any disclaimer, the term of this patent is extended or adjusted under 35 U.S.C. 154(b) by 0 days.

(21) Appl. No.: 10/088,576

(22) PCT Filed: Sep. 20, 2000

(86) PCT No.: PCT/US00/25680

§ 371 (c)(1),  
(2), (4) Date: Jul. 1, 2002

(87) PCT Pub. No.: WO01/21399

PCT Pub. Date: Mar. 29, 2001

Related U.S. Application Data

(60) Provisional application No. 60/155,364, filed on Sep. 20, 1999.

(51) Int. Cl.⁷ .................................................. B30B 5/06
(52) U.S. Cl. .................... 156/583.5; 156/498; 156/499; 156/555; 428/98
(58) Field of Search ................................ 156/498, 499, 156/555, 580, 582, 583.1, 583.5; 100/151, 154, 307, 310, 312; 425/371; 428/98

(56) References Cited

U.S. PATENT DOCUMENTS

| | | | |
|---|---|---|---|
| 2,797,728 A | 7/1957 | Slayter et al. | 154/1.7 |
| 3,591,434 A | 7/1971 | Hartstein | 156/178 |
| 3,663,331 A | 5/1972 | Solbeck | 156/181 |
| 3,686,048 A | 8/1972 | Schirtzinger | 156/161 |
| 3,737,950 A | 6/1973 | Bolliand et al. | 19/65 T |
| 4,132,828 A | 1/1979 | Nakamura et al. | 428/366 |
| 4,265,691 A | 5/1981 | Usui | 156/172 |
| 4,411,722 A | 10/1983 | Yazawa, deceased et al. | 156/167 |
| 4,498,941 A | 2/1985 | Goldsworthy | 156/148 |
| 4,511,424 A | 4/1985 | Usui | 156/426 |
| 4,687,528 A | 8/1987 | Held | 156/150 |
| 4,794,855 A * | 1/1989 | Okajima et al. | 100/154 |
| 5,061,545 A | 10/1991 | Li et al. | 428/195 |
| 5,097,783 A | 3/1992 | Linville | 114/103 |
| 5,536,356 A * | 7/1996 | Stuerzel | 156/514 |
| 5,558,016 A | 9/1996 | De Brock | 100/93 P |
| 6,227,271 B1 * | 5/2001 | Pourmand et al. | 156/498 |

FOREIGN PATENT DOCUMENTS

| | | | |
|---|---|---|---|
| CA | 889 808 | 1/1972 | |
| DE | 30 46 432 A1 | 8/1982 | B30B/5/06 |
| DE | 30 46 431 A 1 | 9/1982 | B30B/5/06 |
| EP | 0 255 596 | 2/1988 | B29C/43/48 |
| EP | 0 292 266 A2 | 11/1988 | B29B/15/08 |
| EP | 0 470 584 A2 | 6/1991 | B32B/31/20 |
| EP | 0 885 803 A2 | 12/1998 | B63H/9/06 |

(List continued on next page.)

OTHER PUBLICATIONS

International Search Report (Hunter Douglas Inc., et al) PCT/US00/00571; Int'l. Filing date Oct. 1, 2000.

(List continued on next page.)

Primary Examiner—James Sells

(57) ABSTRACT

This invention relates to a lamination apparatus and in particular to a dual belt driven, continuous pressure lamination apparatus that utilizes pressure, heat and cooling to bond at least two substrates (plies) with an adhesive between the layers of the substrates. The pressure laminator of the present invention has been specifically designed to permit the permanent joining of at least two fabric substrates with an adhesive between the fabric substrates, with little or no shrinkage occurring during the lamination process. The resulting non-woven fabric advantageously has the appearance of a woven fabric, but has superior strength characteristics there over. The pressure laminator of the present invention can have other uses, for example, printed circuit board substrate manufacture, and the like, as will be appreciated by those having ordinary skill in this art.

36 Claims, 7 Drawing Sheets

FOREIGN PATENT DOCUMENTS

| | | | |
|---|---|---|---|
| GB | 1 440 081 | 6/1976 | ............ D04H/3/04 |
| GB | 1 463 969 | 2/1977 | |
| GB | 2 041 028 | 9/1980 | ............ D04H/3/04 |
| JP | 63-267525 | 11/1988 | ............ B29C/43/44 |
| JP | 01-210318 | 8/1989 | ............ B29C/43/48 |
| WO | WO 80/02850 | 12/1980 | |
| WO | WO 00/41523 | 7/2000 | |
| WO | WO 01/21383 A1 | 3/2001 | |
| WO | WO 01/21399 A1 | 3/2001 | |
| WO | WO 01/21877 A1 | 3/2001 | |

OTHER PUBLICATIONS

International Search Report (Hunter Douglas Inc., et al) PCT/US00/25680; Int'l. Filing date Sep. 20, 2000.

International Search Report (Hunter Douglas Inc., et al) PCT/US00/25681; Int'l. Filing date Sep. 20, 2000.

International Search Report (Hunter Douglas Inc., et al.) PCT/US00/25793; Int'l. Filing date Sep. 20, 2000.

U.S.S.N. 09/869,941 filed Jan. 4, 2002 corresponds to PCT International Publication No. WO 00/41523 referenced above as letter BM.

U.S.S.N. 10/088,614 filed Mar. 19, 2002 corresponds to PCT International Publication No. WO 01/21877 A1 referenced above as letter BO.

U.S.S.N. 10/088,613 filed Mar. 19, 2002 corresponds to PCT International Publication No. WO 01/21383 A1 referenced above as letter BP.

* cited by examiner

PRESSURE LAMINATOR APPARATUS AND NON WOVEN FABRIC FORMED THEREBY

CROSS-REFERENCE TO RELATED APPLICATIONS

This application is the Section 371(c) filing of copending PCT Application No. PCT/US00/25680, filed Sep. 20, 2000, which designated the United States, and which application was published in the English language on Mar. 29, 2001 as WO 01/21399. This application also claims domestic priority from the following copending and commonly owned provisional application, U.S. Ser. No. 60/155,364 filed Sep. 20, 1999. These documents are hereby incorporated herein by reference.

FIELD OF THE INVENTION

This invention relates to a lamination apparatus and in particular to a dual belt driven, continuous pressure lamination apparatus that utilizes pressure, heat and cooling to bond at least two substrates (plies) with an adhesive between the layers of the substrates. The laminator of the present invention overcomes many of the disadvantages of prior art laminators, including shrinkage of materials, and the like.

SUMMARY OF THE INVENTION

This invention relates to a lamination apparatus and in particular to a dual belt driven, continuous pressure lamination apparatus that utilizes pressure, heat and cooling to bond at least two substrates (plies) with an adhesive between the layers of the substrates.

The laminator of the present invention can be employed to make a variety of composite and/or reinforced materials. One or more of the component parts of the laminate (i.e., the substrates or plies) may be a woven fabric material, a non-woven fabric web, or a mat of fibers. Adhesive materials, preferably thermoplastic materials, are used to bond the various substrates in the laminate construct. These materials may be melted and remelted over and over. When used to laminate yarns, especially polymer yarns, thermoplastic copolyester adhesives are preferred, as these materials may be selected to have a melting temperature below the melting temperature of the yarns. Industrial type laminates that may be formed using the laminator of the present invention include natural and/or synthetic fabric-based, asbestos-based, glass-based, nylon-based, flame-retardant and/or flame-resistant based, and mixtures thereof. Laminates of other materials may also be prepared as will be appreciated by those having ordinary skill in the field.

Non-woven fabrics are one especially preferred class of materials used as the plies or substrates in the pressure laminator of the present invention. Non-woven fabrics are similar to woven and knitted fabrics in that all are planar, inherently flexible, porous structures composed of natural or synthetic fiber materials (i.e., yarns, threads, or filaments). Non-woven fabrics are unique in that they can be engineered to resemble woven or knitted fabrics, but they can also be made to have superior physical characteristics over woven or knitted fabrics. Thus, non-woven fabrics are highly influenced by the properties of their constituent fibers and the manner in which the non-woven fabric is prepared. Typical methods for preparing non-woven fabrics include mechanical, chemical and thermal interlocking of layers or networks of the fiber materials.

In preferred embodiments, the substrates are at least two non-woven fabric substrates, one of the fabric substrate representing the weft strands and another representing the warp strands. The adhesive used to bond the nonwoven substrates should be activated by heat during the lamination process. The combination of pressure, heating to activate the adhesive and rapid cooling of the joined substrates minimizes shrinkage and sets the yarn size in the final non-woven fabric laminate. In addition, because the laminate is being formed under pressure, the warp and weft yarns are forced into intimate contact, giving the final laminate the appearance of a woven product.

The lamination apparatus of the present invention has an outer housing or frame in which a rectangular pressure box is mounted. The shape of the box need not be rectangular, but this shape is currently preferred. The pressure box comprises two spaced apart sections, an upper section and a lower section, each of which has pressure seals along its four edges, and each of which is further provided with a plurality of both heating and cooling elements. Two counter rotating drive belts, an upper drive belt and a lower drive belt, contact one another at and together run through a space between the two sections of the pressure box. The belts are dimensionally larger (length and width) than the pressure box. This is necessary to permit pressurization of the box, both above and below the two belts. One belt is driven in a clockwise manner and the other belt is driven in a counter-clockwise manner. Once the belts are in motion, one end of the pressure box is the inlet (feed) end and one end is the outlet end of the laminator.

The lower section of the pressure box is mounted rigidly to the frame or housing, whereas the upper section of the pressure box can be adjusted as necessary to permit access to the interior of the box. Normally, the sections are spaced apart sufficiently to permit passage of the drive belts there through under pressure (or in a depressurized state), with or without material to be laminated there between.

During the lamination process, substrate materials to be laminated are passed through a pressure seal at the inlet end of the pressure box, and into the space between the two drive belts. Air pressure applied to the upper and lower sections of the pressure box is used to compress the air-impermeable belts toward one another, creating a diaphragm effect between the belts, thereby compressing the substrates situated there between. The upper and lower sections of the pressure box are equipped with a plurality of heating and cooling elements, which are used to activate and set the thermoplastic adhesive between the substrate layers.

In an especially preferred embodiment, the plurality of heating and cooling bars located in the lower section of the pressure box are rigidly mounted, whereas the plurality of heating an cooling bars in the upper section of the pressure box are mounted so as to float on top of the materials being laminated. This arrangement has been found to be especially useful in the preparation of non-woven fabrics. Shrinkage is minimized or eliminated and the final laminate has the physical characteristics (feel and appearance) of a thermo-mechanicaily finished fabric.

Advantageously, at least about 10%, preferably at least about 25% and most preferably about 50% of the box interior at the inlet end of the pressure box is provided with heat bars, and the remainder of the pressure box, again, at least about 10%, preferably at least about 25% and most preferably about 50% of the box interior, is provided with cooling bars. The heating bars are ideally located at the inlet end of the pressure box and the cooling bars are ideally located at the outlet end of the pressure box. If desired, multiple zones of heating and cooling could be included within the pressure box; e.g., heat/cool, heat/cool, heat/cool, etc.

Movement of the two belts through the pressure box allows for the continuous feeding of substrate materials and thermoplastic adhesive enter the laminator through an entry pressure seal. Once therein, the substrates are nipped or pressed together by the diaphragm effect caused by the pressure applied to the belts. The pressed substrates are then heated under pressure, melting the thermoplastic adhesive. This allows the substrate layers to come closer together, with at least some portions of the warp and weft yarn strands becoming coplanar or nearly coplanar. The heated substrates are then cooled, while still under pressure, forming the final laminate. The cooled laminate exits the pressure box through an exit pressure seal, where it is collected as desired.

When two or more non-woven polyester substrates (e.g., at least one warp substrate and at least one weft substrate) are laminated in this apparatus, the thickness of the laminate at the outlet end of the laminator is at least 5%, preferably at least 10% and most preferably at least about 20% less than the combined thickness of the substrates and thermoplastic adhesive, as measured at the inlet end of the laminator.

The current rectangular pressure has a pressure area about 1500 square inches ($in^2$). The drive belts, which are substantially non-porous, are pressurized from both sides of the pressure box with air (or other fluid medium) pressure of at least 2 psi, preferably at least about 5 psi, and most preferably at least about 10 psi. Higher pressures can be achieved with modification of the equipment to support and sustain the same. This pressure applied to the belts is equivalent to a compressive weight (force) ranging from about 5000 lbs to about 50,000 lbs, applied over the 1500 $in^2$ area of the current pressure box. For laminating non-woven fabrics, a compressive force from about 10,000 lbs to about 25,000 lbs is typical, and a compressive force of about 15,000 lbs (at 10 psi gauge) has been found to be especially preferred to date. This is important because in a traditional laminator, which uses top and bottom platens, if a weight of 15,000 lbs was placed on the top platen to provide the compressive force to effect lamination, any belt running hereunder would likely break. Traditional high pressure laminators usually employ a series of actions; move, stop, press; move, stop, press; etc., when operating in a "continuous" manner.

In the present invention, the use of a fluid pressure medium, e.g., air (or other gas, e.g., steam) or liquid (e.g., water, oil, etc), allows the belts to move, even though being pressured from both the top and the bottom. The belts of the present laminator slide through, even though they encounter forces that would break a belt in a conventional laminator.

This invention is also directed to a method of manufacturing non-woven fabrics using the pressure lamination apparatus, and to the non-woven fabrics formed thereby. The pressure laminator of the present invention has been specifically designed to permit the permanent joining of at least two non-woven fabric substrates with an adhesive between the fabric substrates, with little or no shrinkage occurring, during the lamination process. While not wishing to be bound by theory, it is believed that shrinkage is prevented or limited herein, due to the high pressure on the belts, which prevents the laminate from slipping, thereby preventing or limiting shrinkage. The resulting non-woven composite fabric advantageously has the appearance of a woven fabric, but has superior strength characteristics there over.

While designed for a specific purpose, the pressure laminator of the present invention can have other uses, for example, printed circuit board substrate manufacture, decorative laminating, industrial laminating, and the like, as will be appreciated by those having ordinary skill in this art.

DETAILED DESCRIPTION OF THE PREFERRED EMBODIMENTS

As described above, the present invention is directed to a lamination apparatus and in particular to a dual belt driven, continuous pressure lamination apparatus that utilizes pressure, heat and cooling to bond at least two substrates (plies) with an adhesive between the layers of the substrates. If desired, the laminator of the present invention could also be used to stabilize a single ply material.

In general, the pressure lamination apparatus of this invention comprises a housing or frame in which a pressure box is mounted. The pressure box comprises two spaced apart pressure sections, an upper section and a lower section, wherein the space formed between the two pressure sections defines the lamination section. Two counter rotating drive belts, an upper drive belt and a lower drive belt, are rotatably mounted in the housing or frame, and the belts contact one another and are pulled through the lamination section by drive rollers mounted at the outlet end. A pressure generator is used to supplying air (or other fluid medium—liquid or gas) pressure to the upper and lower sections of the pressure box for compressing substrate materials carried between the two drive belts. Pressure is maintained because the box has pressure seals all around the points of contact with the belt.

In the rectangular box of one preferred embodiment, metal side seals are provided on the sides of both the upper and lower sections of the pressure box. Metal inlet and outlet seals are also provided on the upper and lower sections of the pressure box, ensuring that the desired diaphragm effect can be created therein. When pressurized, the apparatus caused the pressure lamination of substrates situated between the two belts.

In the rectangular box of another preferred embodiment, Teflon® (PTFE) or rubber coated metal side seals are provided on the sides of both the upper and lower sections of the pressure box. Rubber inlet and outlet seals are also provided on the upper and lower sections of the pressure box, ensuring that the desired diaphragm effect can be created therein. When pressurized, the apparatus caused the pressure lamination of substrates situated between the two belts.

Figure 1:
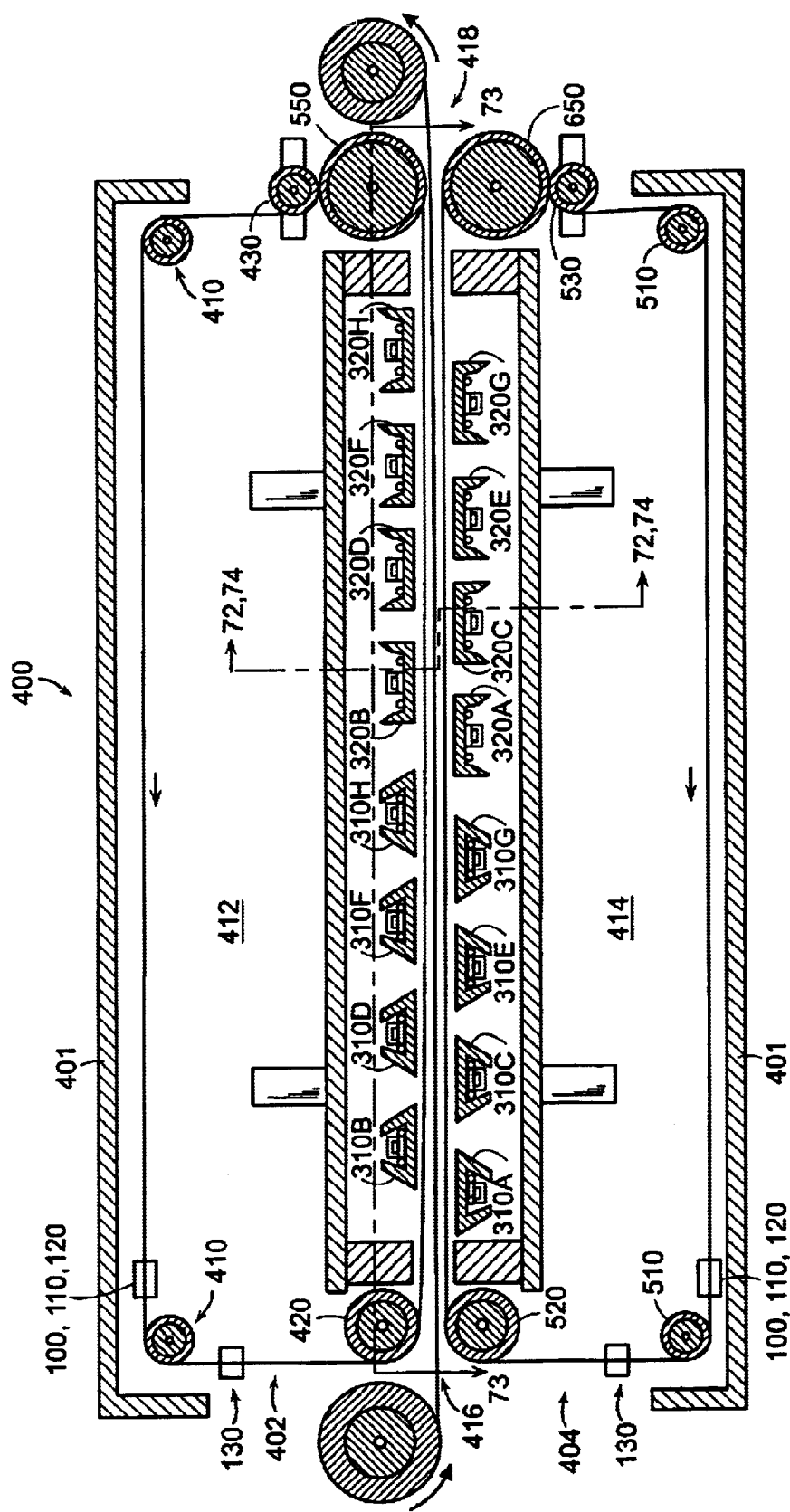
FIG. 1 is a side view of a preferred embodiment of the pressure box and drive belt system for the laminator of the invention in which eight heater bars (four in each section) and eight cooling bars (four in each section) are used for pressure lamination of non-woven fabric substrates.

Referring to FIG. 1, a number of the essential components of the preferred pressure box 401 used in the pressure laminator of the present invention 400 are shown in cross-section. As illustrated, two rotatable belts, top belt 402 and bottom belt 404, mounted on a plurality of support rollers (top—410, 420, 430; bottom—510, 520, 530), are pulled through the pressure box 401, between the upper section 412 and the lower section 414, entering at the inlet end 416 and exiting at the outlet end 418, by their respective drive rollers 550 (top) and 650 (bottom).

Alignment of the two rotating belts 402 and 404, is maintained by an electric alignment system comprising an alignment carriage 100, alignment pivot 110, electric alignment servo 120 and electric alignment eye 130. If either of the belts moves out of alignment, the electric eye 130 detects the same and activates the alignment servo, which causes the belt to be adjusted as necessary by lateral movement of the alignment carriage 100.

In the illustrated embodiment, eight spaced apart radiant heat bars (310A, 310B, 310C, 310D . . . 310H) are shown at the inlet end 416 of pressure box 401 and eight spaced apart cooling bars (320A, 320B, 320C, 320D . . . 320H) are shown at the outlet end 418 of pressure box 401. Four of the heat bars are rigidly mounted in the lower section 414 of the pressure box 401, namely heat bars 310A, 310C, 310E and 310G. The other four radiant heat bars (310B, 310D, 310F and 310H) are flexibly mounted such that they float above the upper belt, permitting materials of varied thickness to pass there under. Four of the cooling bars are rigidly mounted in the lower section 414 of the pressure box 401, namely cooling bars 320A, 320C, 320E and 320G. The other four cooling bars (320B, 320D, 320F and 320H) are flexibly mounted such that they float above the upper belt, permitting materials of varied thickness to pass there under.

As illustrated, the plurality of heating and cooling bars are preferably arranged in a staggered configuration. Thus, the substrate is heated from below, then above, then below, etc., and the cooling is accomplished in the same manner; the substrate is cooled from below, then above, then below, etc. This arrangement permits rapid and uniform heating, as well as rapid and uniform cooling of the substrate materials being laminated in the pressure laminator. The uniformity of heating and cooling under pressure leads to improved physical characteristics of the resulting laminates. In the case of non-woven fabrics laminated in this manner, shrinkage of the fabrics is held to a minimum and the resulting laminated material has the appearance and feel of a woven fabric.

In one embodiment, at least 75 percent of the belt width is heated and cooled by these elements. For example, on a 29-inch wide belt, the central 22 inches are heated and cooled. On a 76-inch wide belt, the central 60 inches would be heated and cooled. The Reliant ER177A heat bars (England) are each provided with a thermocouple to measure the temperature delivered to the belts. The cooling bars are each provided with water fed cooling pipes.

In another embodiment, the heating and cooling is accomplished by steam and cold water; each fed to an appropriate section of the laminator, in both the upper and lower sections. The use of a high-pressure gas and fluid medium creates both pressure and the requisite heating/cooling action that was alternatively achieved by the heating and cooling bars together with high-pressure air. If desired, infra-red heating may also be employed in this embodiment, and cooling may be accomplished by other means, including water spray, providing non-contact heating and/or cooling options.

The thickness of the PTFE impregnated fiberglass belt can be modified as desired, and depends on the nature of the materials being laminated and the desired operating speed in feet per minute (fpm). For laminating non-woven fabrics, a belt thickness ranging from 2 to 20 mil, preferably 5 to 15 mil has been found satisfactory. Belts of 14-mil thickness have been operated at 5 fpm, with a temperature of 380° F. being delivered to the substrates. Belts of 5-mil thickness have been operated at 12 fpm, with a temperature of 380° F. being delivered to the substrates. Optimum belt speeds of 50, 60, 70 . . . 100 fpm can be achieved by modification of the belt thickness and/or composition. The optimum belt speed for non-woven fabric lamination is currently believed to be 60–70 fpm. Another way in which to achieve higher speeds is to simply increase the size of the laminator apparatus. The current preferred apparatus has a length of about 4 feet. Increasing the size 2–10X would allow for faster operating speeds.

During the lamination process the substrate material may create a counter-pressure as any entrapped air in the substrates expands. To deal with this counter-pressure, at lease one (or both) of the FTFE (Teflon®) impregnated fiberglass drive belts used in the pressure laminator of the present invention can be modified on the outside edges, to comprise a thick (about 0.125 inch) porous glass fiber mat. This porous glass fiber mat allows the expanded air from the heated laminate to escape via this sideways (transverse) porosity.

Figure 2:
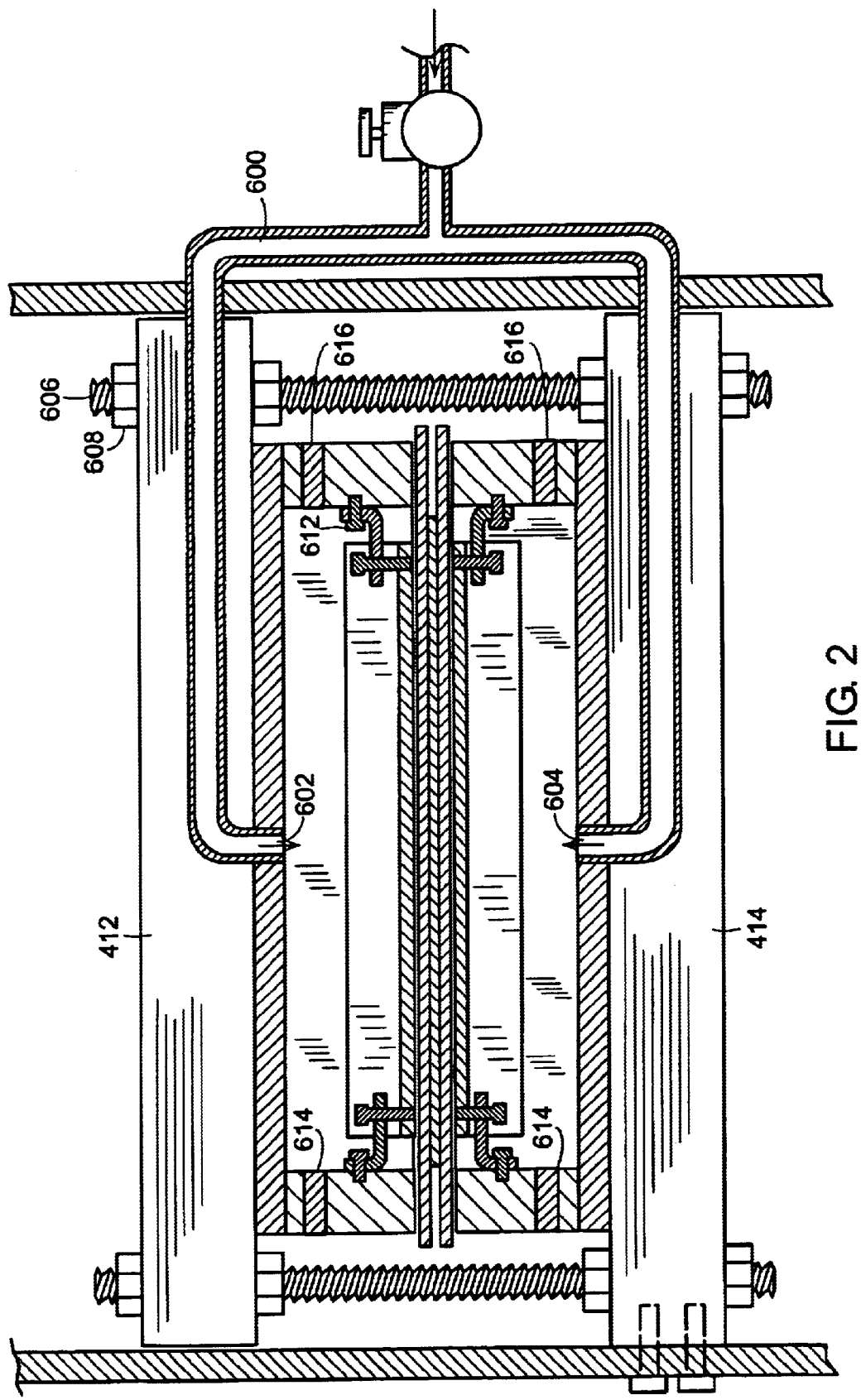
FIG. 2 is an end view of the pressure box of FIG. 1, which shows the pressure delivery system for the upper and lower sections of the pressure box.
Figure 4:
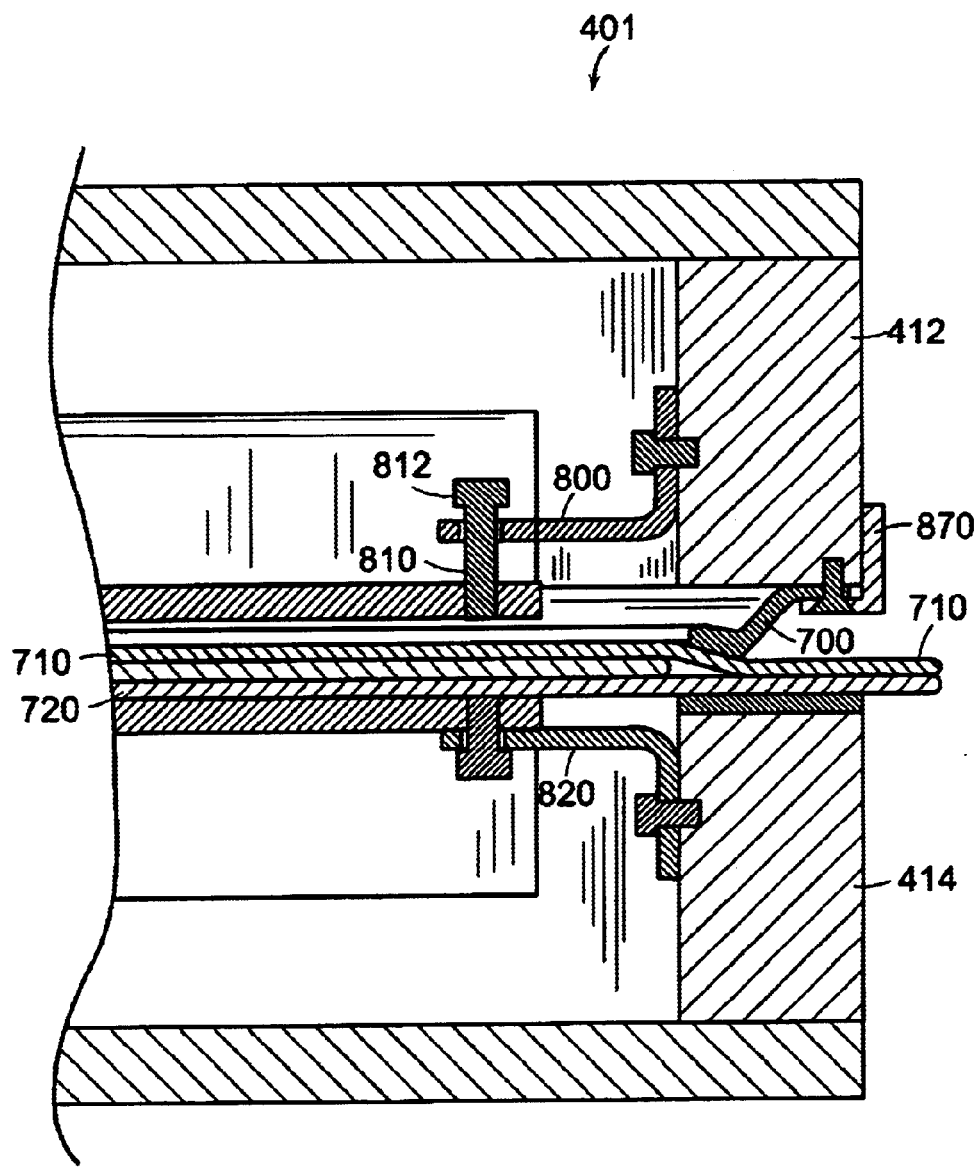
FIG. 4 is a side view of the pressure box of FIG. 1, showing the mounting brackets for the upper section (displaceable) heating and cooling bars and the mounting brackets for the lower section (fixed) heating and cooling bars. Also shown is one embodiment of a side sealing element.

FIG. 2 illustrates in cross-section, the end view of pressure box 401, showing in particular the air pressure feed line 600, and the preferred points of contact thereof 602 and 604 with the upper section 412 and lower section 14 of the pressure box, respectively. The pressure box is advantageously made out of metal, such as aluminum (from 2 to 5 inches thick) and is held together by a plurality of threaded steel rods and nuts 606 and 608. As shown in FIGS. 2 and 4, the heating and cooling bars located in the lower section 414 of the pressure box are locked in place at each end by a fixed bracket 820. The heating and cooling bars located in the upper section 412 of the pressure box ride on a pin bracket mount 800/812, which allows upward motion of the bars, while gravity keeps the bars resting on the upper belt. A plurality of cooling water lines, inlet 614 and outlet 616 are also shown in FIG. 2. The electrical heating wires (not shown) are provided in a manner similar to the water lines.

Figure 3:
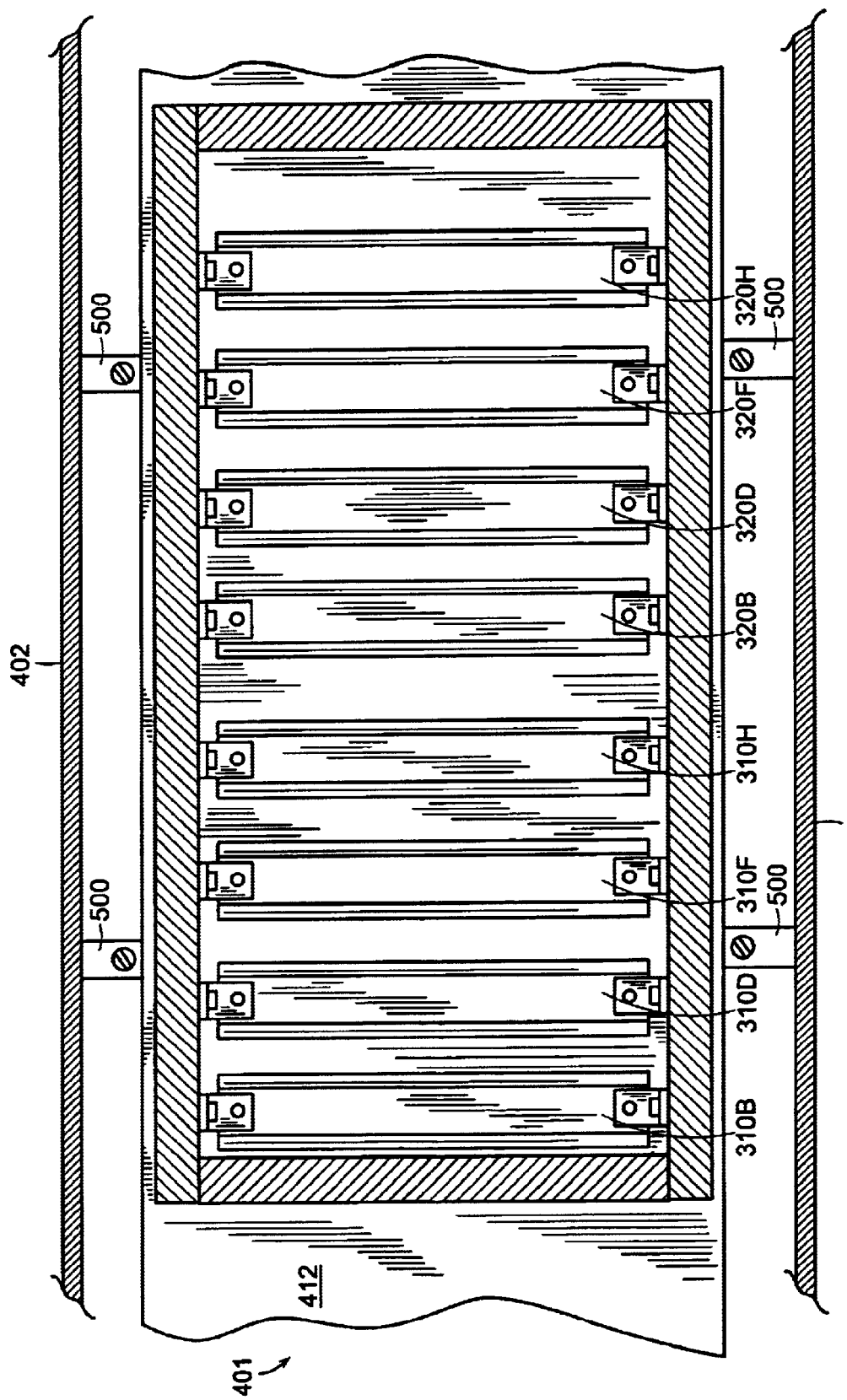
FIG. 3 is a top view of the upper section of the pressure box of FIG. 1, showing the spacing of the heating and cooling bars.

FIG. 3 illustrates a top view of the interior of the upper section 412 of the pressure box 401, showing the currently preferred arrangement of the upper heating bars (310B, 310D, 310F and 310H) and cooling bars (320B, 320D, 320F and 320H). The pressurized box 401 is held together by steel bars 500 mounted to the threaded rods 606 shown in the four corners. Not shown in this illustration are the nuts that thread thereon. The sides 402 of the housing or frame, to which the steel bars and all rollers and controls are mounted, are also shown in this drawing.

FIG. 4 illustrates, the pin bracket for the upper section, vertically displaceable, heating and cooling bars. As illustrated, the pin bracket comprises a steel mounting bracket 800, fixed at one end to the aluminum side wall of the upper section 412 of the pressure box. A slot (not shown) is provided near the opposite end of bracket 800, through which a post 810 rides. The post 810 is mounted to the top of the heating or cooling bar at one end and capped at the opposite end 812, thereby limiting the vertical displacement distance of the heating and cooling bars. The bracket for the lower section heating and cooling bars 820 is also a steel bracket, but it is rigidly attached to both the heating and cooling bars and the aluminum side wall of the lower section 414 of the pressure box.

A side pressure seal is also illustrated in FIG. 4. This seal is formed from a high temper curved aluminum slat 700 (e.g., 0.008×1⅜"- Venetian blind) sandwiched between 2 mil PTFE (Teflon®) tape 710 on the upper side and 10 mil ultrahigh molecular weight polyethylene tape 720 on the bottom side. The seal is held in place by a steel bracket 870.

Figure 5:
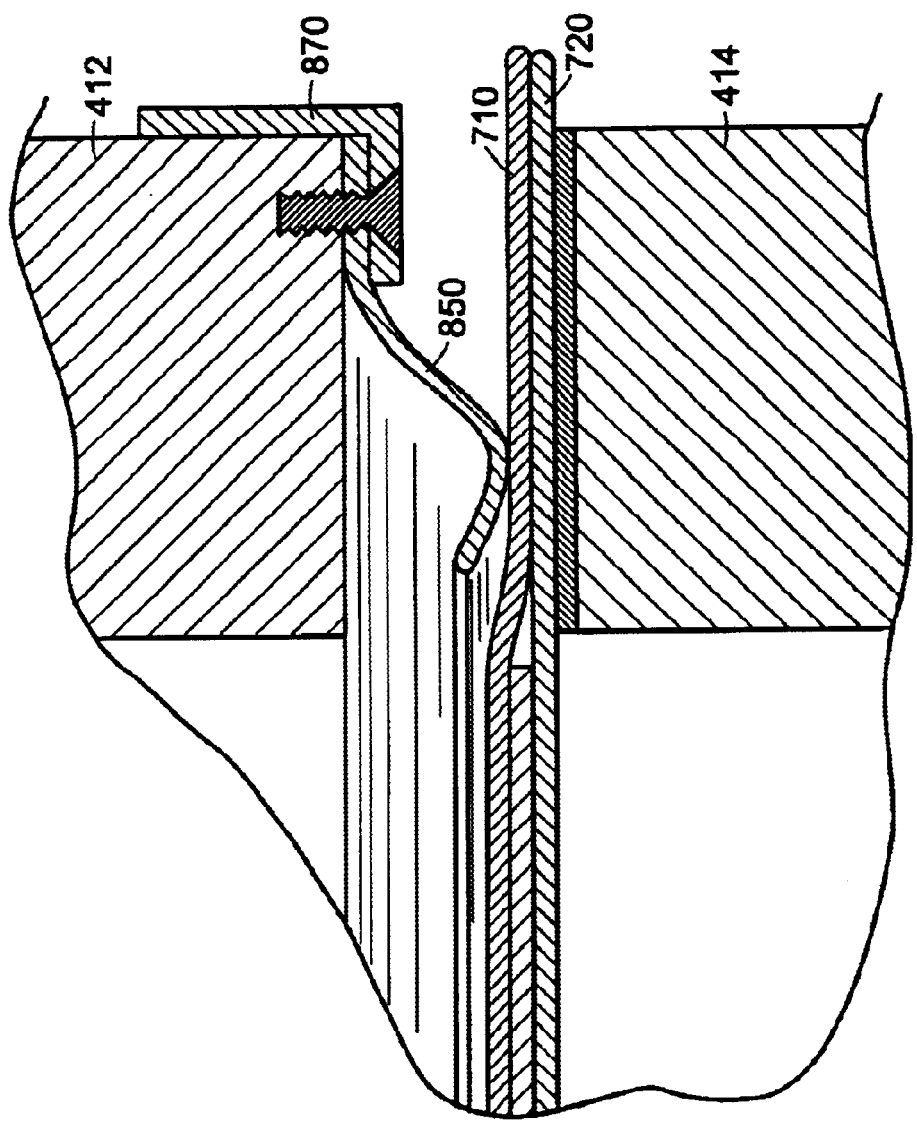
FIG. 5 is a side view of the pressure box of FIG. 1, showing one embodiment of the pressure box inlet pressure seal element.
Figure 6:
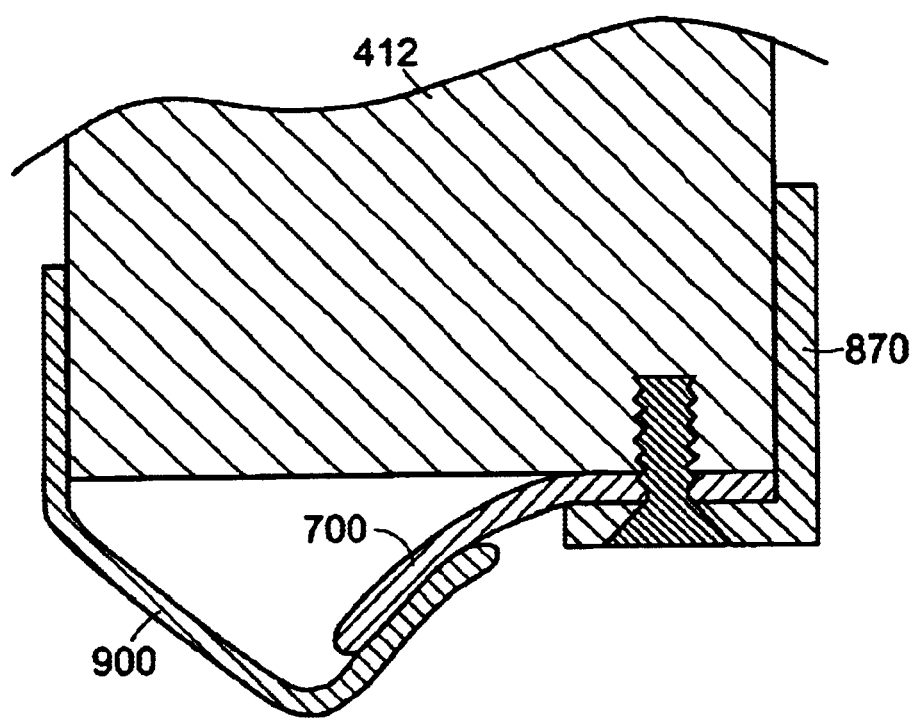
FIG. 6 is a side view of the pressure box of FIG. 1, showing one embodiment of the pressure box outlet pressure seal.

As illustrated in FIGS. 5 and 6, it has been discovered that the aluminum pressure seal taught in FIG. 4 can be simplified, such that the side and inlet pressure seals consists predominantly of the curved aluminum slat 850 as previously described. The ultrahigh molecular weight polyethylene tape can be omitted and the PTFE tape can be omitted, except in the corners of the pressure box, where the tapes still prove useful. This improved side seal and inlet pressure seal is illustrated in FIG. 5.

The exit pressure seal is shown in FIG. 6. In addition to the curved aluminum slat 700, the belt side of the aluminum slat is coated with 5 mil PTFE (Teflon®) fiberglass cloth 900, which extends beyond the end of the aluminum seal and mounts to the inside of the pressure box frame. This exit seal design keeps the drive belt from binding on the aluminum slat.

Figure 7A:
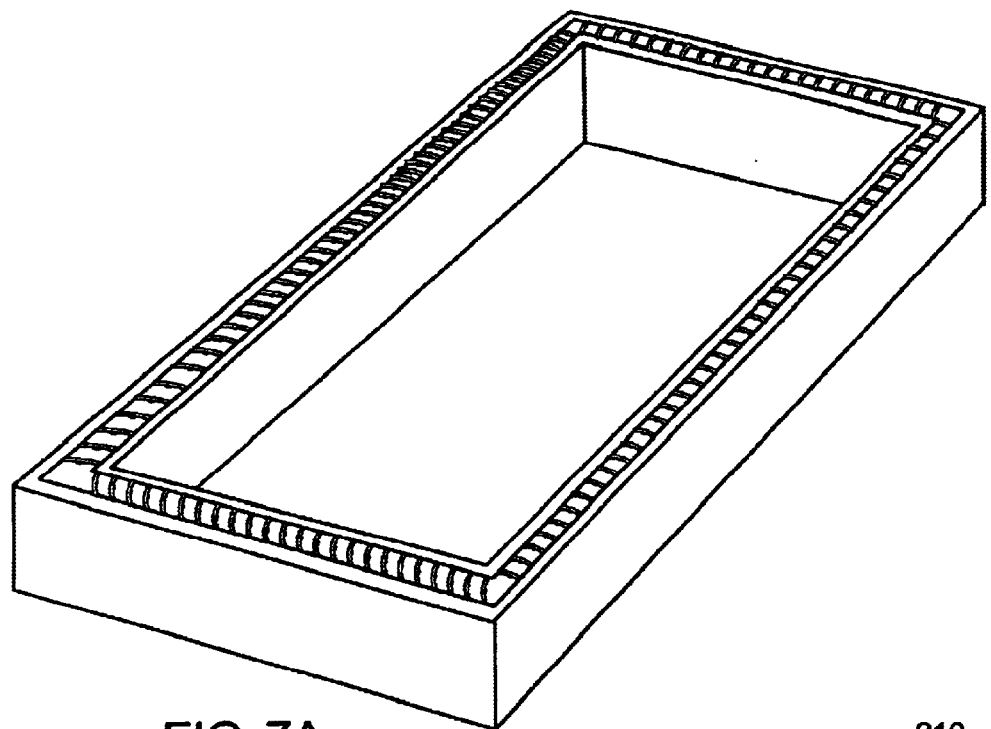
FIGS. 7A, 7B and 7C illustrate aspects of the inflatable rubber bladder seal embodiment for the pressure box sections.
Figure 7B:
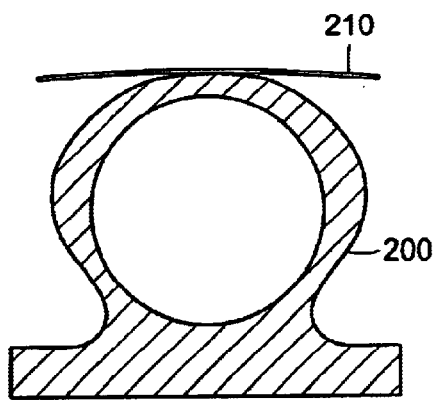
Figure 7C:
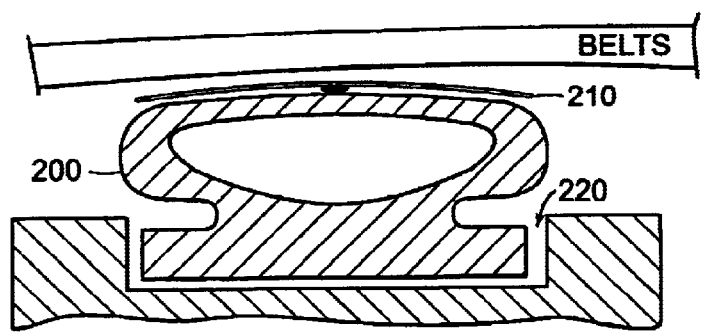

As discussed above, one may also replace these metal seals or more inflatable rubber bladders, which offer several advantages not provided by the above-described metal seals. See FIGS. 7A, 7B and 7C, which depict the positioning of one inflatable bladder 200 (e.g., silicone rubber) on the peripheral edges of the pressure box (FIG. 7A); the bladder 200 as inflated with the Teflon coated metal slip plate 210 (FIG. 7B); and the bladder 200 as partially deformed via belt contact (FIG. 7C) creating the desired seal for the pressure box. A channel 220 is provided in the frame of the pressure box wall for attachment of the rubber bladder (FIG. 7C). An inflatable bladder of this type is used for both the upper and the lower portions of the pressure box.

As the bladders are inflated against the belts, a uniform sealing pressure is created around the periphery of the pressure box. This contrasts with the all-metal seal embodiment, in that the pressure applied to the belts is much more uniform and constant. Also, the bladder sealing effect is much more efficient; as the bladder is provided with a slip-seal surface comprising a metal strip coated with Teflon. This surface directly contacts the belts and allows for smooth running of the same. Direct contact between the belts and the rubber bladder is thus avoided. In the all-metal seal embodiment, a portion of the sealing pressure is contributed by the weight of the floating heating and cooling bars, and leakage of the seals can occur, particularly at the inlet and outlet ends of the laminator.

As described above, this invention is also directed to a method of manufacturing non-woven fabrics using the preferred pressure lamination apparatus, and to the non-woven fabrics formed thereby.

PCT Publication No. WO 00/41523 describes a non-woven warp yarn fabric material, which is one preferred substrate for lamination in the present invention. In general, the PCT Publication describes one preferred substrate for use in the pressure laminator of the present invention. The substrate of the PCT Publication comprises a plurality of yarns that are formed into an aligned group, substantially parallel and equally spaced apart, and held together by a hot melt adhesive applied to one side of the fiber group. This fiber orientation, in which the fibers run in the machine direction, creates a non-woven fabric material substrate in which the fibers mimic warp yarns, which can be combined with one or more woven or non-woven fiber substrates and pressure laminated to create finished products that have the visual impression and physical feel of a woven material.

PCT Publication No. WO 00/41523 also describes the formation of a preferred substrate material used in the pressure laminator of the present invention. In general, the PCT Publication describes an apparatus for fabricating a non-woven fabric composite, which has the appearance of a woven fabric. The apparatus includes a supply station for adhesive coated parallel warp yarns, a support structure for orienting the parallel warp yarns into a cylindrical orientation with the adhesive film on the outside, a weft yarn applicator for wrapping weft yarns around the cylindrically oriented warp yarns, a heating station for activating the adhesive and a cooling station for setting the adhesive, and a cutter for severing the cylindrically formed fabric composite so that it can be flattened and wrapped onto a take-up roller, for transfer to the pressure laminator of the present invention.

The weft yarn applicator disclosed in the PCT Publication includes a rotating drum wherein a plurality of spools of weft yarn material are mounted in circumferentially spaced relationship and a tensioner is provided for applying the weft yarn material around the warp yarns in a predetermined tension which may be the same as, greater than, or less than the tension in the warp yarns. A conical aligner assures that the weft yarns will be delivered to the warp yarn cylinder in substantially perpendicular alignment.

PCT Publication No. WO 00/41523 designates the United States and as such, the disclosure of that publication is hereby incorporated herein by reference.

The present invention has been described in detail, including the preferred embodiments thereof. However, it will be appreciated that those skilled in the art, upon consideration of the present disclosure, may make modifications and/or improvements on this invention and still be within the scope and spirit of this invention as set forth in the following claims.

What is claimed is:

1. A pressure lamination apparatus comprising:

a housing or frame;

a pressure box mounted in the housing or frame, the pressure box comprising upper and lower pressurable sections and a space between the upper and lower sections defining a lamination section;

counter rotating upper and lower drive belts, rotatably mounted in the housing or frame, wherein the belts contact one another at and pass in the same direction through the lamination section;

a fluid medium pressure generator for supplying pressure to the upper and lower sections of the pressure box for compressing the drive belts moving therebetween; and whereby, depending upon the direction of rotation of the belts, one end of the lamination section acts as an inlet for substrates to be laminated and an opposite end acts as an outlet for pressure laminated materials;

wherein the pressure box further comprises pressure seals at the sides and the inlet and outlet ends and wherein the pressure seals comprise one or more rubber bladders.

2. A pressure lamination apparatus, comprising:

a frame, two counter rotating upper and lower drive belts rotatably mounted in the frame and adapted to be movable in a same direction into said inlet of the lamination section and out of said outlet of the lamination section wherein the drive belts are adapted for receiving a substrate material therebetween for treatment within the lamination section, a pressure box mounted in the frame, said pressure box further comprising, spaced apart upper and lower plattens forming a space therebetween defining a lamination section having an inlet and an outlet for receiving the counter rotating upper and lower drive belts, a compressed air generator for supplying pressure within the space of the laminator section, at least one pressure seal mounted in the upper platten, said pressure seal contacting the upper drive belt so as to contain said pressure within said lamination section thereby compressing said upper belt and said lower belt against said substrate material.

3. The lamination apparatus of claim 2, wherein the pressure seal is at least one bladder.

4. The lamination apparatus of claim 2, further including heating and cooling elements within the interior of the lamination section for heating and cooling the upper and lower belts.

5. A pressure lamination apparatus, including:
a frame;
a pressure box mounted in the frame, comprising spaced apart upper and lower sections forming a space therebetween defining a lamination section;
two counter rotating upper and lower drive belts, rotatably mounted in the frame and adapted to be movable in the same direction through the space between the upper and lower sections of the pressure box, whereby in accordance with the direction of movement of the belts, one end of the pressure box acts as an inlet for a substrate material to be treated and an opposite end acts at as an outlet for the treated substrate material; and
a fluid medium pressure generator for supplying pressure to the upper and lower sections of the pressure box for compressing the drive belts moving therebetween, wherein the upper pressure box section comprises a pressure seal and wherein the pressure seal comprises at least one rubber bladder.

6. The lamination apparatus of claim 5, wherein the pressure seals are located at the sides and the inlet and outlet ends of the pressure box.

7. The lamination apparatus of claim 5, wherein the pressure seals comprise metal.

8. The lamination apparatus of claim 5, wherein the at least one rubber bladder is provided with a slip-seal surface comprising a metal strip coated with PTFE.

9. The lamination apparatus of claim 5, wherein the drive belts contact one another at the pressure box.

10. The lamination apparatus of claim 5, wherein the upper section of the pressure box further comprises a heat source.

11. The lamination apparatus of claim 10, wherein the heat source comprises a plurality of heating elements.

12. The lamination apparatus of claim 10, wherein the heat source comprises a steam powered heating section.

13. The lamination apparatus of claim 5, wherein the upper section of the pressure box further comprises a cooling source.

14. The lamination apparatus of claim 13, wherein the cooling source comprises a plurality of cooling elements.

15. The lamination apparatus of claim 14, wherein the upper section of the pressure box further comprises a plurality of heating elements.

16. The lamination apparatus of claim 13, wherein the cooling source comprises a cold water cooling section.

17. The lamination apparatus of claim 5, wherein the lower section of the pressure box further comprises a heat source.

18. The lamination apparatus of claim 17, wherein the heat source comprises a plurality of heating elements.

19. The lamination apparatus of claim 17, wherein the heat source comprises a steam powered heating section.

20. The lamination apparatus of claim 17, wherein the heat source employs infra-red heating.

21. The lamination apparatus of claim 5, wherein the lower section of the pressure box further comprises a cooling source.

22. The lamination apparatus of claim 21, wherein the cooling source comprises a plurality of cooling elements.

23. The lamination apparatus of claim 22, wherein the lower section of the pressure box further comprises a plurality of heating elements.

24. The lamination apparatus of claim 21, wherein the cooling source comprises a cold water cooling section.

25. The lamination apparatus of claim 22, wherein the cooling elements are each provided with water fed cooling pipes.

26. The lamination apparatus of claim 23, wherein the cooling elements in the lower section are fixed in place.

27. The lamination apparatus of claim 15, wherein the plurality of heating and cooling elements in the upper section of the pressure box arm mounted so as to float on top of the substrate materials.

28. The lamination apparatus of claim 15 or claim 23, wherein the plurality of heating and cooling elements are arranged in a staggered configuration.

29. The lamination apparatus of claim 5, wherein the lower section of the pressure box is mounted rigidly to the frame.

30. The lamination apparatus of claim 5, wherein the upper section of the pressure box is mounted to the frame in an adjustable manner.

31. The lamination apparatus of claim 5, wherein the drive belts are pressurized within a range of from about 5000 lbs to about 50,000 lbs, over an area of about 1500 square inches.

32. The lamination apparatus of claim 5, wherein the drive belts are pressurized within a range of from about 10,000 lbs to about 25,000 lbs, over an area of about 1500 square inches.

33. The lamination apparatus of claim 5, wherein the drive belts are pressurized at about 15,000 lbs over an area of about 1500 square inches or 10 psi.

34. The lamination apparatus of claim 5, further comprising an alignment system, including an electric eye, an alignment servo and an alignment carriage, wherein the electric eye is adapted to detect either of the belts moving out of alignment and capable of activating the alignment servo so as to cause the belts to be adjusted by lateral movement of the alignment carriage.

35. A laminated non-woven fabric formed in the apparatus of claim 5, said laminated fabric comprising:
a first non-woven layer and a second non-woven layer laminated to one another to form a laminated composite fabric;
said first non-woven layer having yarns aligned in the machine direction;
said second non-woven layer having yarns aligned substantially perpendicular to the machine direction;
said laminated composite fabric further including a film of adhesive disposed between the first and second non-woven layers.

36. The lamination apparatus of claim 18, wherein the heating elements in the lower section are fixed in place.

* * * * *

UNITED STATES PATENT AND TRADEMARK OFFICE
CERTIFICATE OF CORRECTION

PATENT NO. : 6,805,771 B1
DATED : October 19, 2004
INVENTOR(S) : Wendell B. Colson and Kevin Dann It is certified that error appears in the above-identified patent and that said Letters Patent is hereby corrected as shown below:

<u>Title page,</u>
Item [73], Assignee, should read -- Hunter Douglas Inc. --.

Signed and Sealed this

Fifth Day of July, 2005

JON W. DUDAS
*Director of the United States Patent and Trademark Office*